United States Patent
Liu et al.

(10) Patent No.: US 7,613,001 B1
(45) Date of Patent: Nov. 3, 2009

(54) HEAT DISSIPATION DEVICE WITH HEAT PIPE

(75) Inventors: Jin-Biao Liu, Shenzhen (CN);
Hong-Cheng Yang, Shenzhen (CN);
Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 3 days.

(21) Appl. No.: 12/118,757

(22) Filed: May 12, 2008

(51) Int. Cl.
*H05K 7/20* (2006.01)
*H01L 23/36* (2006.01)

(52) U.S. Cl. ............... 361/700; 361/687; 361/679.47; 361/679.52; 361/699; 361/719; 165/80.3; 165/80.4; 165/104.33

(58) Field of Classification Search ........... 361/679.47, 361/679.52, 687, 688, 699, 700, 701, 715–722; 165/80.2, 80.3, 80.4, 80.5, 104.21, 104.26, 165/104.33, 104.34, 185; 257/706–727; 174/15.1, 15.2, 16.1, 16.3, 252
See application file for complete search history.

(56) References Cited

U.S. PATENT DOCUMENTS

| | | | |
|---|---|---|---|
| 7,079,394 B2 * | 7/2006 | Mok | 361/700 |
| 7,286,357 B2 * | 10/2007 | Wung et al. | 361/700 |
| 7,325,590 B2 * | 2/2008 | Kim et al. | 165/104.33 |
| 7,369,412 B2 * | 5/2008 | Peng et al. | 361/715 |
| 7,495,920 B2 * | 2/2009 | Chen et al. | 361/719 |
| 2006/0162901 A1 * | 7/2006 | Aizono et al. | 165/80.4 |
| 2009/0122480 A1 * | 5/2009 | Chou et al. | 361/679.52 |

* cited by examiner

*Primary Examiner*—Michael V Datskovskiy
(74) *Attorney, Agent, or Firm*—Frank R. Niranjan

(57) ABSTRACT

A heat dissipation device is used for removing heat from at least two adjacent first and second electronic devices in a computer enclosure. The heat dissipation device includes a first heat sink mounted on the first electronic device and a second heat sink mounted on the second electronic device. The first heat sink includes a base, a first fin unit mounted on the base and two heat pipes extending from the base outwardly. Second and third fin units engage with the two heat pipes, respectively. The first, second and third fin units are located adjacent to first, second and third openings of the computer enclosure, respectively. The second heat sink is located among the first, second and third fin units of the first heat sink.

18 Claims, 4 Drawing Sheets

HEAT DISSIPATION DEVICE WITH HEAT PIPE

BACKGROUND OF THE INVENTION

1. Field of the Invention

The present invention relates to heat dissipation devices, and particularly to a heat dissipation device having a heat pipe for cooling an electronic component, such as an integrated circuit package.

2. Description of Related Art

It is well known that a large amount of heat is produced during operation of an electronic device in a computer system. The heat generated must be quickly removed to ensure normal operation of the electronic device. Typically, a heat dissipation device is attached to the electronic device to absorb the heat from the electronic device. The heat absorbed by the heat dissipation device is then dissipated to ambient air. However, with the increasing performance of the computer system, more and more heat-generating electronic devices, for example, CPUs and graphic processing units (GPUs), need to be crowded in the computer system simultaneously, meanwhile the heat generated by each of these electronic devices is greatly increased. At the same time, due to the compact fashion, the computer system has a limited space for receiving these electronic devices, which further deteriorates the heat dissipation problem of these electronic devices in the computer system.

What is needed, therefore, is a heat dissipation device which has a great dissipating capability for electronic devices in a computer system whilst utilizes a room of the computer system efficiently.

SUMMARY OF THE INVENTION

A heat dissipation device in accordance with a preferred embodiment of the present invention is used for removing heat from at least two adjacent first and second electronic devices in a computer enclosure. The heat dissipation device includes a first heat sink mounted on the first electronic device and a second heat sink mounted on the second electronic device. The first heat sink comprises a base attached to the first electronic device, a first fin unit mounted on the base and first and second heat pipes extending from the base outwardly. Second and third fin units engage with the first and second heat pipes, respectively. The first, second and third fin units are located adjacent to first, second and third openings defined by the computer enclosure, respectively. The second heat sink is located among the first, second and third fin units of the first heat sink.

Other advantages and novel features of the present invention will become more apparent from the following detailed description when taken in conjunction with the accompanying drawings.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
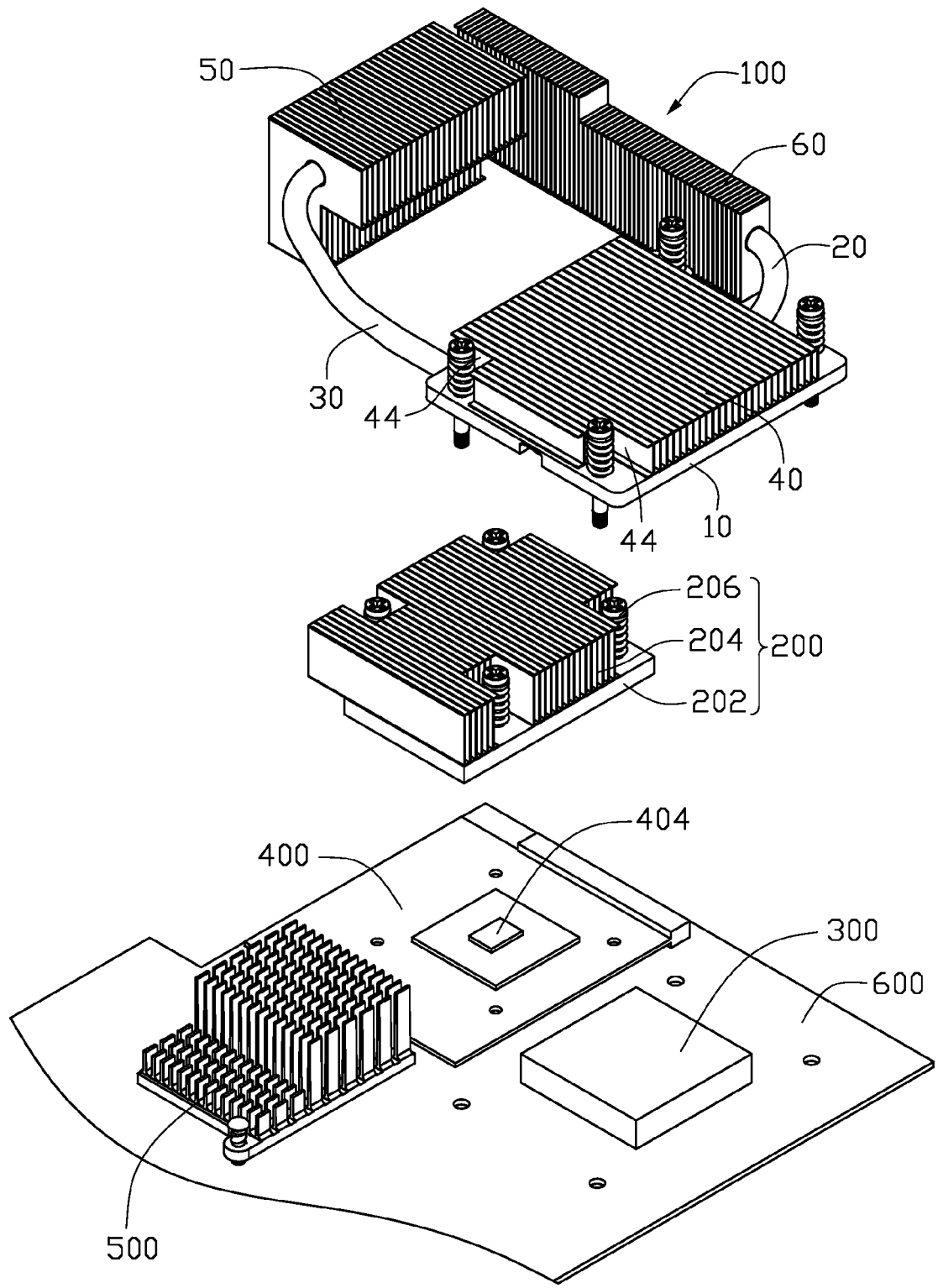
FIG. 1 is a partially exploded, isometric view of a heat dissipation device in accordance with a preferred embodiment of the present invention.
Figure 4:
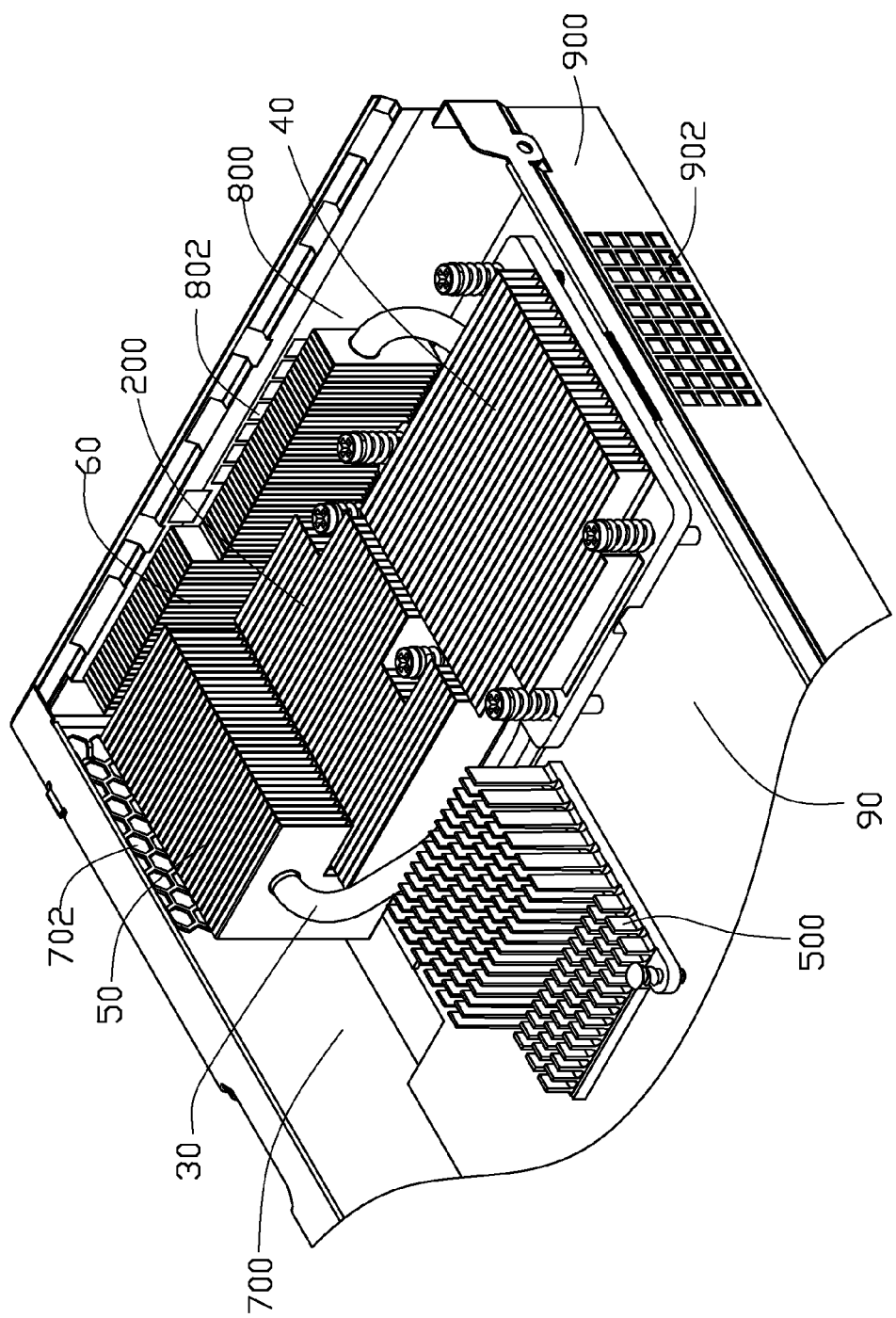
FIG. 4 is an assembled view of the heat dissipation device of FIG. 1 located in a computer enclosure.

Referring to FIG. 1 and FIG. 4, a heat dissipation device of a preferred embodiment of the invention is located in a computer enclosure 90 and is used for dissipating heat from electronic devices arranged therein. The enclosure 90 includes a first panel 700 defining a plurality of first ventilating openings 702, a second panel 800 being perpendicular to the first panel 700 and defining a plurality of second ventilating openings 802, and a third panel 900 being parallel to the first panel 700 and defining a plurality of third ventilating openings 902. The second panel 800 interconnects the first panel 700 and the third panel 900. The first ventilating openings 702 are used as an exhaust port. Electrical fans (not shown) are mounted near the first ventilating openings 702 for helping expelling heated air in the computer enclosure 90 to an outside thereof through the first ventilating openings 702. The second and third ventilating openings 802, 902 are used as intake ports for facilitating cool air outside the computer enclosure 90 to enter the computer enclosure 90. A CPU 300 and a video card 400 adjacent to the CPU 300 are mounted on a printed circuit board 600 located in the enclosure 90. A GPU 404 is mounted on the video card 400. A north bridge (not shown) is mounted on the printed circuit board 600 at a side of the GPU 404. The heat dissipation device comprises a first heat sink 100 secured on the CPU 300 for dissipating heat generated by the CPU 300, a second heat sink 200 mounted on the GPU 404 for dissipating heat generated by the GPU 404, and a third heat sink 500 attached to the north bridge for dissipating heat generated by the north bridge.

Figure 2:
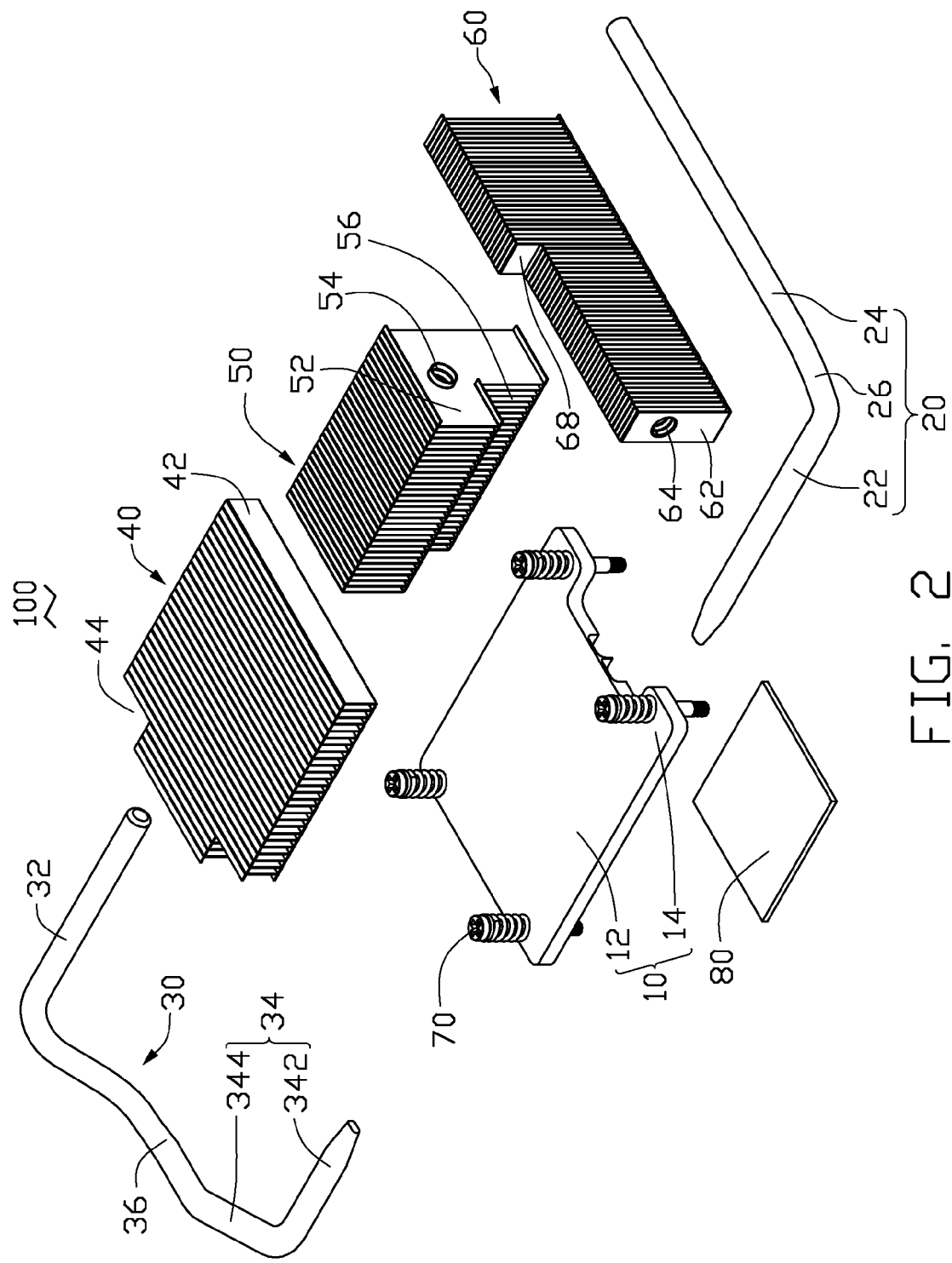
FIG. 2 is an exploded, isometric view of a first heat sink of the heat dissipation device of FIG. 1.
Figure 3:
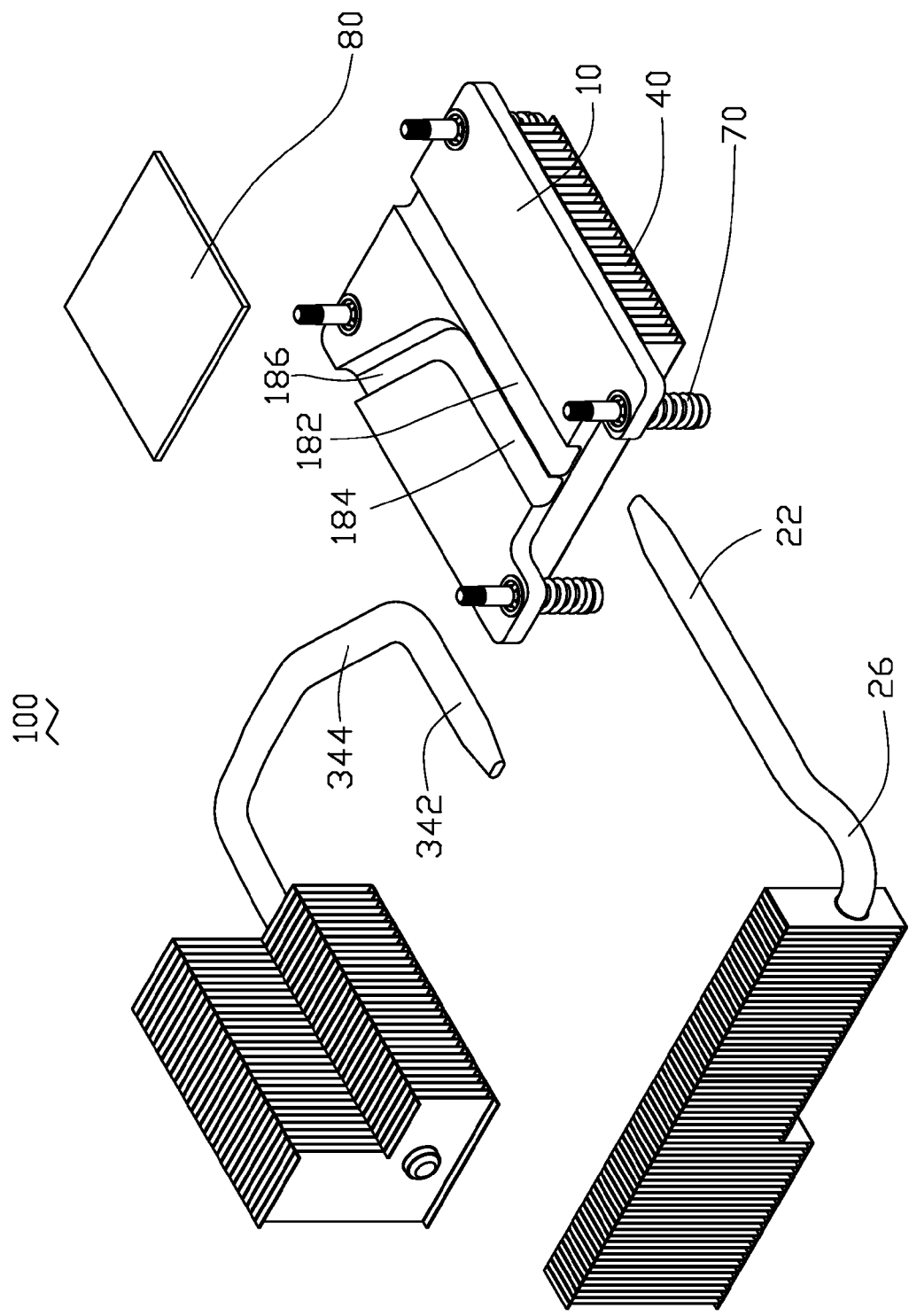
FIG. 3 is a partially assembled view of the first heat sink of the heat dissipation device of FIG. 1, viewed from a bottom aspect thereof.

Referring to FIGS. 1-3, the first heat sink 100 includes a base 10, a first fin unit 40 arranged on the base 10, a second fin unit 50 located at a front side of an assembly of the base 10 and the first fin unit 40, a third fin unit 60 located at a lateral side of the second fin unit 50 and the first fin unit 40, a first heat pipe 20 interconnecting the base 10 and the third fin unit 60 and a second heat pipe 30 interconnecting the base 10 and the second fin unit 50. The first fin unit 40, the second fin unit 50, the third fin unit 60 and the third heat sink 500 are located to surround the second heat sink 200. The first heat sink 100 forms a loop structure encircling the GPU 404.

The base 10 is a metal plate having good heat conductivity, and includes a substantially rectangular body 12 and two spaced and parallel ears 14 extending outwardly and horizontally from two adjacent corners of the body 12. A bottom of the base 10 defines a first straight groove 182 parallel to a lateral edge of body 12 for receiving the first heat pipe 20 therein, a second groove 184 adjacent and parallel to the first groove 182 and a third groove 186 extending from the second groove 184 in a direction outwardly away from the first groove 182. The third groove 186 communicates with the second groove 184. An obtuse angle is defined between the second groove 184 and the third groove 186. The second and the third grooves 184, 186 are used for cooperatively receiving corresponding portions of the second heat pipe 30 therein. A heat-absorbing board 80 is soldered on the bottom of the base 10 and attached to the CPU 300 by four fasteners 70 extending through four corners of the base 10 and fixed to the printed circuit board 600 for absorbing the heat generated by the CPU 300. A bottom area of the heat-absorbing board 80 is smaller than a bottom area of the base 10. The four fasteners 70 are used to extend through the printed circuit board 600 and threadedly engage with a back plate (not shown) located at a bottom of the printed circuit board 600. In other embodiment, the heat-absorbing board 80 can be omitted to make the base 10 be directly in intimately contact with the CPU 300 for dissipating the heat generated by the CPU 300.

The first fin unit 40 comprises a plurality of fins 42. Two corners of the first fin unit 40 which are opposite to two ears 14 are cut away to define two receiving spaces 44 for receiving the two fasteners 70. Each fin 42 is substantially rectangular and made from a metal sheet. Flanges (not labeled) perpendicularly extend from bottom and top edges of the fins 42. The flanges separate the fins 42 at uniform intervals.

The second fin unit 50 comprises a plurality of fins 52. An portion of the second fin unit 50 which is close to the second heat sink 200 is cut away to define a receiving space 56 for partially receiving the second heat sink 200 therein. Each fin 52 is substantially L-shaped and parallel to each other. The fins 52 define a through hole 54 for receiving the second heat pipe 30 therein.

The third fin unit 60 comprises a plurality of fins 62, 68. The fins 62, 68 are parallel to each other and perpendicular to the fins 42 of the first fin unit 40. Bottom faces of the fins 62, 68 are level to each other. Top faces of the fins 68 are higher than top faces of the fins 62. The fins 62, 68 of the third fin unit 60 cooperatively define a through hole 64 for receiving the first heat pipe 20 therein. Flanges (not labeled) perpendicularly extend from bottom, top edges and around the through hole 64 of the third fin unit 60. The flanges separate the fins 62, 68 at uniform intervals.

The first heat pipe 20 comprises a straight and flat evaporation section 22, a condensation section 24 and a curved connecting section 26 interconnecting the condensation section 24 and the evaporation section 22. The evaporation section 22 and the condensation section 24 are perpendicular to each other. The evaporation section 22 is received in the first groove 182 of the base 10, and in intimate contact with the heat-absorbing board 80 to transfer the heat generated by the CPU 300 from the heat-absorbing board 80 to the third fin unit 60.

The second heat pipe 30 comprises a flat evaporation section 34, a straight condensation section 32 and a connecting section 36 interconnecting the condensation section 32 and the evaporation section 34. The evaporation section 34 includes a first straight evaporation section 342 parallel to the condensation section 32 and a second evaporation section 344 extending from the first straight evaporation section 342 towards the second fin unit 50. The first evaporation section 342 and the second evaporation section 344 are in a same plane. An obtuse angle is defined between the first evaporation section 342 and the second evaporation section 344. The first evaporation section 342 and the second evaporation section 344 are respectively received in the second groove 184 and the third groove 186 of the base 10. The first evaporation section 342 and the second evaporation section 344 intimately engage with the heat-absorbing board 80 for transferring the heat generated by the CPU 300 from the base 10 to the second fin unit 50.

The second heat sink 200 comprises a base plate 202 in intimately contact with the GPU 404, a plurality of fins 204 arranged on the base plate 202 and four fasteners 206 extending through the base plate 202 and the printed circuit board 600 to mount the second heat sink 200 on the GPU 404. The fins 204 of the second heat sink 200 are partially received in the receiving space 56 of the second fin unit 50.

Referring also to FIGS. 1-4, in assembly of the heat dissipation device of this embodiment of the invention, the second and third heat sinks 200, 500 are respectively mounted on corresponding positions of the printed circuit board 600. The first heat sink 100 is mounted around the second heat sink 200. The connecting section 36 of the second heat pipe 30 of the first heat sink 100 is located between the second heat sink 200 and the third heat sink 500. The first fin unit 40 is located adjacent to the third ventilating openings 902. The second fin unit 50 is close to the first ventilating openings 702. The second heat sink 200 is partially accommodated in the receiving space 56 of the second fin unit 50. The third fin unit 60 is positioned adjacent to the second ventilating openings 802.

In use of the heat dissipation device of this embodiment of the invention, the heat-absorbing board 80 of the first heat sink 100 absorbs the heat from the CPU 300. The heat in the heat-absorbing board 80 is absorbed by the base 10 and the evaporation sections 22, 34 of the first, second heat pipes 20, 30. A portion of the heat in the base 10 is absorbed by the first fin unit 40 and is dissipated to ambient air. The other portion of the heat in the base 10 is absorbed by the evaporation sections 22, 34 of the heat pipes 20, 30. The heat in the evaporation sections 22, 34 is then transferred to the third and second fin units 60, 50 via the heat pipes 20, 30. Due to the first, second and third fins 40, 50, 60 adjacent to the third, first and second ventilating openings 902, 702, 802, a heat dissipation efficiency of the heat dissipation device is enhanced significantly. By the provision of the loop construction of the first heat sink 100, a room of the computer enclosure is efficiently utilized to enable the CPU 300 which generate the most heat can be sufficiently cooled. Furthermore, an airflow flowing from the third ventilating openings 902 to the first ventilating openings 702 can flow through not only the first fin unit 40 but also the second heat sink 200 and the second fin unit 50. And an airflow from the second ventilating openings 802 to the first ventilating openings 702 can flow through not only the third fin unit 60 but also the second heat sink 200 and the second fin unit 50. Thus, the heat generated by the GPU 404 can also be effectively taken away to an outside of the computer enclosure 90.

Understandingly and alternatively, the heat pipes 20, 30 can be replaced by an integral heat pipe. The integral heat pipe has a middle evaporation section thermally engaging with the base 10 and two condensation sections extending from two opposite ends of the evaporation section to thermally connect with the second fin unit 50 and the third fin unit 60, respectively.

It is believed that the present embodiments and their advantages will be understood from the foregoing description, and it will be apparent that various changes may be made thereto without departing from the spirit and scope of the invention or sacrificing all of its material advantages, the examples herein before described merely being preferred or exemplary embodiments of the invention.

What is claimed is:

1. A heat dissipation device for removing heat from at least two adjacent first and second electronic devices in a computer enclosure, the computer enclosure having a plurality of connecting panels, each of the panels defining a plurality of ventilating openings, the heat dissipation device comprising:
a first heat sink mounted on the first electronic device and forming an annular structure to encircle the second electronic device, the first heat sink comprising:
a base thermally engaging with the first electronic device;
a first fin unit consisting of a plurality of first fins arranged on the base;

a fin assembly located adjacent to the openings of two adjacent ones of the panels of the computer enclosure; and a first heat pipe connecting the base and the fin assembly, wherein the second electronic device is located among the first fin unit, the first heat pipe and the fin assembly.

2. The heat dissipation device as described in claim 1, wherein the fin assembly comprises a second fin unit consisting of a plurality of parallel second fins and a third fin unit consisting of a plurality of parallel third fins, the second fins of the second fin unit being parallel to the first fins of the first fin unit, the third fins of the third fin unit being perpendicular to the first fins of the first fin unit.

3. The heat dissipation device as described in claim 2, wherein the first heat pipe comprises an evaporation section thermally engaging with the base and a condensation section connecting one of the second fin unit and the third fin unit.

4. The heat dissipation device as described in claim 3 further comprising a second heat pipe extending from the base outwardly, wherein the second heat pipe connects the other of the second fin unit and the third fin unit, and the second heat pipe comprises an evaporation section and a condensation section.

5. The heat dissipation device as described in claim 4, wherein the first heat pipe has one end thereof in intimately contact with the base, and the other end thereof engaging with the third fin unit, the second heat pipe has one end thereof in intimately contact with the base, and the other end thereof engaging with the second fin unit.

6. The heat dissipation device as described in claim 4, wherein the first heat pipe and the second heat pipe respectively extend outwardly from two adjacent sides of the base.

7. The heat dissipation device as described in claim 4, wherein a heat-absorbing board is intimately attached to a bottom of the base, the evaporation sections of the first and second heat pipes sandwiched between the base and the heat-absorbing board, and the condensation section of the first heat pipe engaging with the third fin unit, the condensation section of the second heat pipe engaging with the second fin unit.

8. The heat dissipation device as described in claim 7, wherein the bottom of the base defines a first groove receiving the evaporation section of the first heat pipe therein, a second groove receiving the evaporation section of the second heat pipe therein, and a third groove in communication with the second groove and receiving the evaporation section of the second heat pipe therein.

9. The heat dissipation device as described in claim 8, wherein the second groove is adjacent and parallel to the first groove, the third groove extending from the second groove in a direction outwardly away from the first groove, and the third groove being joined with the second groove and defining an obtuse angle with the second groove.

10. The heat dissipation device as described in claim 4, wherein the evaporation section of the first heat pipe and the evaporation section of the second heat pipe are flat.

11. A heat dissipation device for removing heat from at least two adjacent first and second electronic devices in a computer enclosure, the heat dissipation device comprising:

a first heat sink mounted on the first electronic device and the first heat sink comprising a base for thermally engaging with the first electronic device, a first fin unit consisting of a plurality of first fins arranged on the base, a fin assembly located adjacent to a plurality of openings of the computer enclosure, and a first heat pipe extending from the base outwardly and thermally engaging with the base and the fin assembly; and a second heat sink mounted on the second the electronic device, the second heat sink being surrounded by the first heat pipe, the fin assembly and the first fin unit of the first heat sink.

12. The heat dissipation device as described in claim 1, wherein the fin assembly comprises a second fin unit and a third fin unit, and the first heat pipe comprises an evaporation section thermally engaging with the base and a condensation section extending through the third fin unit.

13. The heat dissipation device as described in claim 12 further comprising a second heat pipe extending outwardly from the base, wherein the second heat pipe comprises an evaporation section thermally engaging with the base and a condensation section extending through the second fin unit.

14. The heat dissipation device as described in claim 13, wherein the first heat pipe and the second heat pipe respectively extend outwardly from the two adjacent sides of the base.

15. The heat dissipation device as described in claim 12, wherein the second fin unit partially overlaps on the second heat sink.

16. A computer system comprising:

a computer enclosure having first and second parallel panels and a third panel interconnecting the first and second panels, wherein the first panel defining an air exhaust therein, the second panel defining a first air intake therein and the third panel defining a second air intake therein;

a printed circuit board received in the computer enclosure;

first and second electronic devices mounted on the printed circuit board;

a first heat sink having a base mounted on the first electronic device, a first fin unit mounted on the base, a second fin unit located adjacent to the second air intake and a third fin unit located adjacent to the air exhaust; and heat transferring means thermally connecting the base, the second fin unit and the third fin unit together for transferring heat from the base to the second fin unit and the third fin unit; and a second heat sink mounted on the second electronic device;

wherein when a first airflow flows from the first air intake to the air exhaust, the first airflow flows through the first fin unit, the second heat sink and the third fin unit to the air exhaust and wherein when a second airflow flows from the second air intake to the air exhaust, the second airflow flows through the second fin unit, the second heat sink and the third fin unit to the air exhaust.

17. The computer system of claim 16, wherein the heat transferring means comprises first heat pipe connecting the base and the second fin unit and a second heat pipe connecting the base and the third fin unit.

18. The computer system of claim 16, wherein the heat transferring means comprises a heat pipe having an evaporation section connecting with the base and two condensation sections extending from the evaporation section and thermally connecting with the second and third fin units.

* * * * *